United States Patent [19]

Wanzer

[11] 4,229,826
[45] Oct. 21, 1980

[54] WIDE BAND IMPEDANCE MATCHING DEVICE

[76] Inventor: C. L. Wanzer, 111 S. Coleman, Spokane, Wash. 99206

[21] Appl. No.: 910,149

[22] Filed: May 30, 1978

[51] Int. Cl.³ ............................................. H04B 1/44
[52] U.S. Cl. ................................ 455/83; 343/861; 370/32; 455/129; 455/289; 455/340
[58] Field of Search .............. 325/21, 178, 381, 488, 325/387, 440, 171, 386; 343/180, 860, 861; 455/78, 83, 121, 129, 282, 289, 338, 340; 370/32

[56] References Cited

U.S. PATENT DOCUMENTS

| | | | |
|---|---|---|---|
| 2,112,320 | 3/1938 | Wilhelm | 343/860 |
| 2,186,068 | 1/1940 | Hammond et al. | 325/171 |
| 2,650,298 | 8/1953 | Thias et al. | 325/488 |
| 2,738,471 | 3/1956 | Cassutt | 336/30 |
| 3,162,809 | 12/1964 | Yax | 325/25 |
| 3,166,368 | 1/1965 | Higgins et al. | 339/9 |
| 3,188,590 | 8/1965 | Early | 336/149 |
| 3,193,785 | 7/1965 | Mann et al. | 336/138 |
| 3,464,015 | 8/1969 | Brabham | 343/861 |
| 3,825,864 | 7/1974 | Ramstrom | 334/39 |
| 4,085,366 | 4/1978 | Padgett | 325/387 |
| 4,112,377 | 9/1978 | Tanner et al. | 325/440 |

OTHER PUBLICATIONS

ARRL, "Radio Amateur's Handbook," 41'st Edition, 1964, pp. 355-358.

*Primary Examiner*—Marc E. Bookbinder
*Attorney, Agent, or Firm*—Wells, St. John & Roberts

[57] ABSTRACT

A wide band impedance matching device is described for matching the impedance of an antenna transmission line to a radio transceiver over a wide band of radio frequencies. The device includes an impedance matching network having an inductor and two capacitors that electrically interconnect in either a capacitance "T" mode or a capacitance "π" mode. The device also includes an efficient bypass circuit that is capable of electrically bypassing the impedance matching network to effectively directly interconnect the antenna transmission line to the transceiver.

10 Claims, 7 Drawing Figures

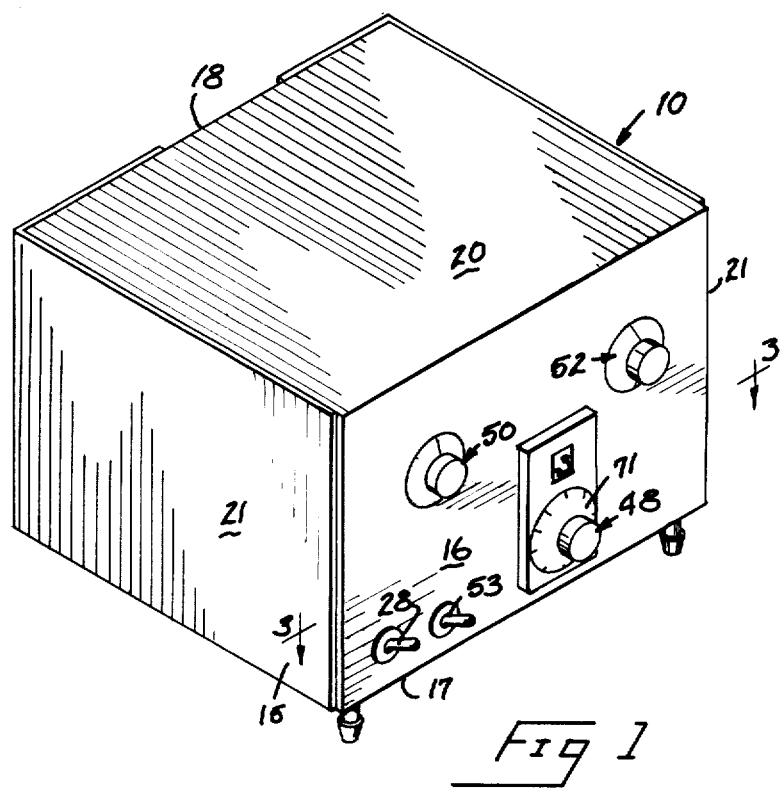
Fig 1
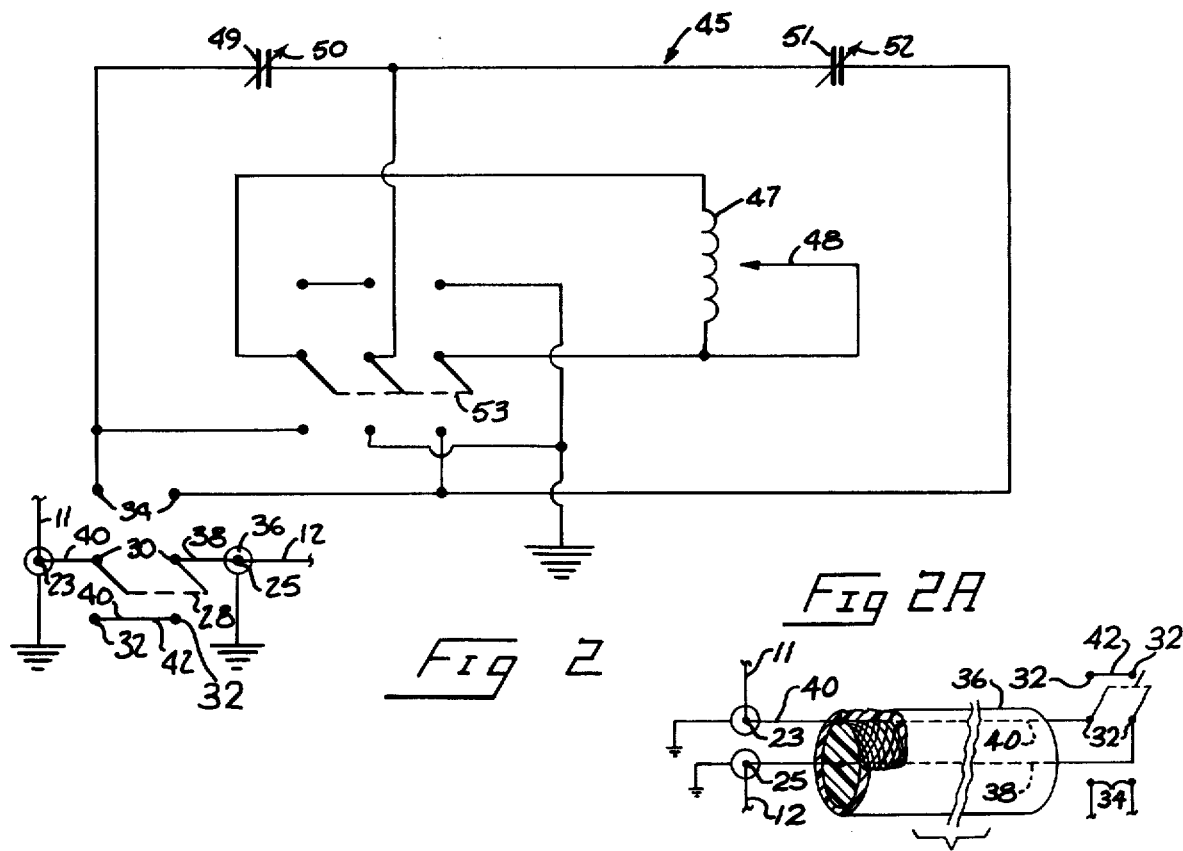
Fig 2
Fig 2A

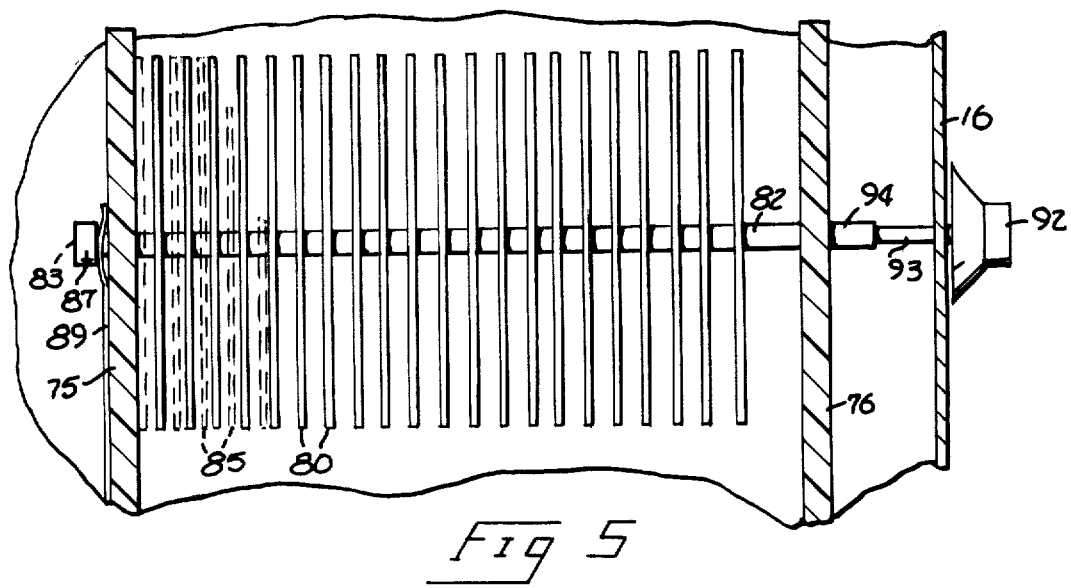
Fig 5
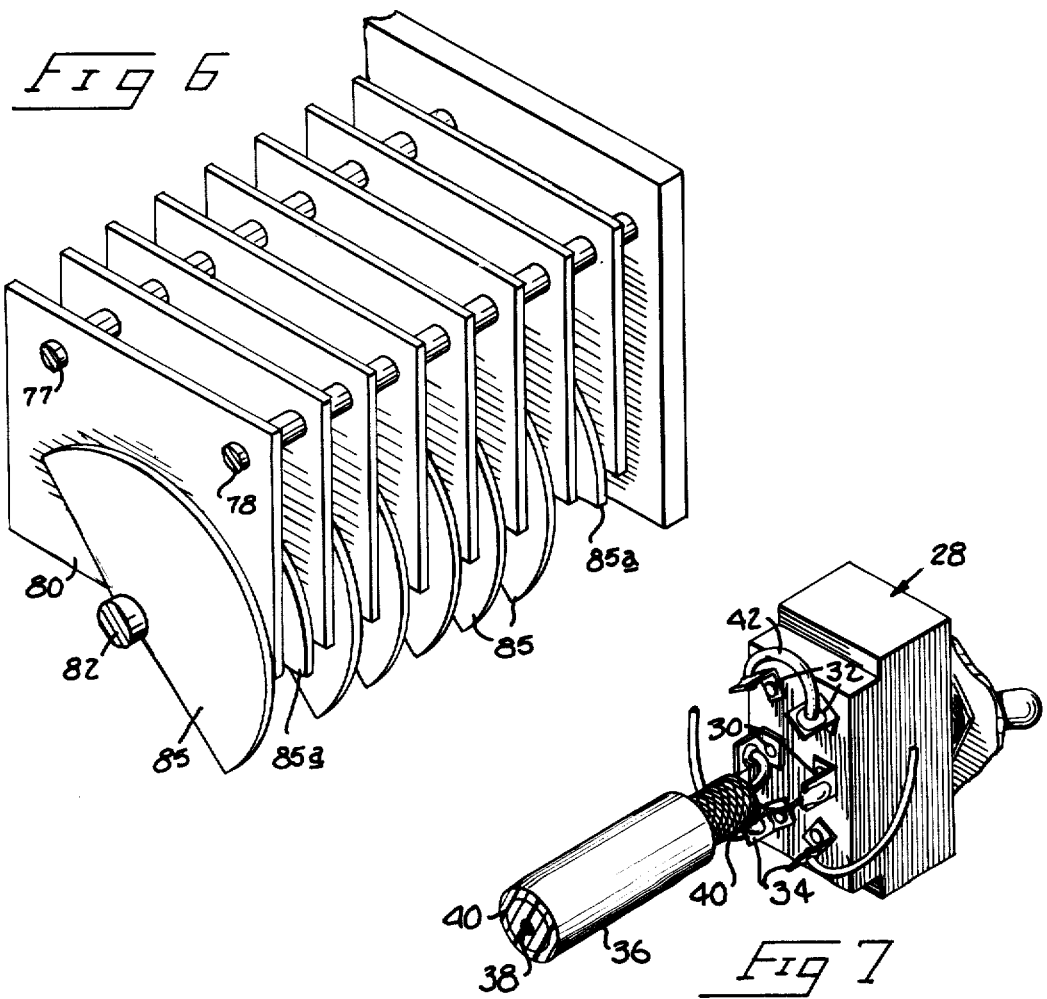
Fig 6
Fig 7

WIDE BAND IMPEDANCE MATCHING DEVICE

BACKGROUND OF THE INVENTION

This invention relates to impedance matching devices for matching the impedance of an antenna transmission line to the radio frequency amplifier of a radio transceiver utilized by amatuer radio operators.

One of the principal objects of this invention is to provide a wide band impedance matching device which is quite versatile and capable of operating over a wide band of frequencies preferably between one and eight tenths and thirty megacycles.

A further object of this invention is to provide a very compact and efficient impedance matching device that has a wide range capability.

A further object of this invention is to provide an impedance matching device which is capable of directly interconnecting the antenna transmission line with the output of the radio transceiver to bypass the device without significantly attenuating the radio signal.

An additional advantage is to provide an impedance matching device that need not be physically disconnected from the transceiver and the transmission line when the device is not in use.

A further object of this invention is to provide a wide band impedance matching device that is capable of efficiently matching high and low impedance antenna transmission lines.

A still further object of this invention is to provide an impedance matching device that is capable of being sold at a reasonable price for the amatuer radio market and yet capable of efficiently operating over a wide frequency range normally utilized by amatuer radio operators.

These and other objects and advantages of this invention will become apparent upon reading the following detailed description of a preferred embodiment.

BRIEF DESCRIPTION OF THE DRAWINGS

A preferred embodiment of this invention is illustrated in the accompanying drawings, in which:

FIG. 1 is an isometric view of an impedance matching device which is the subject of this invention;

FIG. 2 is an electric schemmatic view of an electrical circuit of the impedance matching device that is illustrated in FIG. 1;

FIG. 2A is an enlarged detail electrical schematic view of a feed system;

FIG. 5 is a fragmentary horizontal cross-sectional view taken along line 5—5 in FIG. 4;

FIG. 6 is a fragmentary isometric view of a capacitor that is utilized in the impedance matching device; and FIG. 7 is an isometric view of a bypass switch that is utilized in the feed system.

DETAILED DESCRIPTION OF A PREFERRED EMBODIMENT

Figure 3:
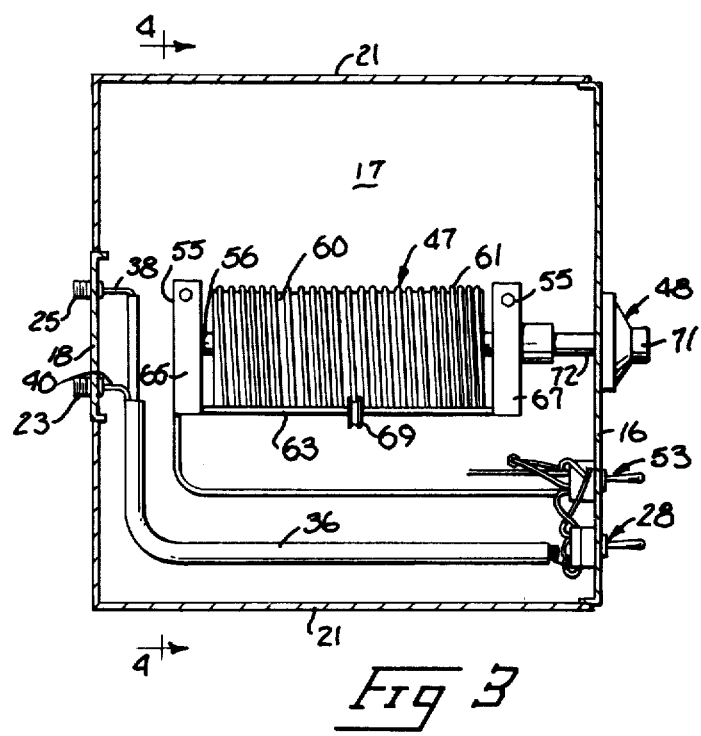
FIG. 3 is a horizontal cross-sectional view taken along line 3—3 in FIG. 1 illustrating a feed system to the antenna transmission line and to the transceiver and an inductor.

Referring in detail to the drawings, there is illustrated in FIG. 1 a wide band impedance matching device 10 that is preferably capable of impedance matching a wide band radio transceiver to a transmission line of an antenna. The device 10 is capable of matching the antenna to the transceiver over a wide band of frequencies, preferably from one and eight tenths to thirty megacycles. The radio transceiver has an output line 11 that is illustrated in schemmatic form in FIG. 2 as an input to the matching device 10. The device 10 is connectable to an antenna transmission line 12. Preferably both the output line 11 of the transceiver and the transmission line 12 of the antenna are coaxial cables.

The impedance matching device 10 includes an enclosed chassis housing 15 that has a front control panel 16, a bottom panel 17, a back panel 18, a top panel 20 and side panels 21. An input connector or jack 23 (FIG. 3) is mounted in the back panel 18 for connection to the output line 11 of the radio transceiver. An output connector or jack 25 is also mounted on the back panel 18 adjacent to the input connector 23 for connecting the matching device 10 to the transmission line 12 of the antenna.

The matching device 10 includes a bypass switch means 38 (FIG. 1, 2 and 7) that is mounted on the front panel 16. The switch 28 is preferably a two-position switch having a double pole, double throw structure. The switch 28 (FIG. 3 and 4) includes input or first pair of terminals 30, second pair of terminals 32 and output or third pair of terminals 34. The switch 28 is designed so that the first pair of terminals 30 are alternatively electrically connected to the second pair of terminals 32 when the switch is in an "OFF" or "BY-PASS" position or the first pair of terminals 30 are connected to the third pair of terminals 34 when the switch 28 is in an "ON" or "OPERATING" position.

The matching device 10 includes a coaxial feed cable 36 that is operatively connected between the connectors 23 and 25 and the by-pass switch 28 for feeding the radio signal to an impedance matching network 45 when the switch 28 is in the "ON" position and for directly interconnecting the input line 11 with the transmission line 12 to bypass network 45 when the switch 28 is in the "BY-PASS" position. The coaxial cable 36 provides a continued impedance match into and out of the device when the bypass switch means 28 is in the "BY-PASS" position to effectively isolate the device without an impedance mismatch. Preferably the coaxial feed cable 36 is a 52 ohm coaxial cable and has a first or center conductor 38 that directly connects the output connector 25 to one of the switch terminals 30. The coaxial feed cable 36 has a second or outer conductor 40 that directly connects the input connector 23 and the other switch terminal 30.

The matching device further includes a bridging means 42 directly, electrically interconnecting the second pair of terminals 32 so that when the switch 28 is in the "BY-PASS" position the output line 11 is directly connected through the coaxial feed cable 36 to the transmission line 12 without the radio signal being processed by the impedance matching network 45. Such a feature greatly reduces any radio signal attenuation caused by the introduction of an intermediate device between the transceiver and the transmission line particularly at the upper frequencies. The coaxial feed cable 36 directly processes the radio signal into and out of the matching device 10 on the coaxial conductors 38 and 40 with very little signal attenuation.

The impedance matching network 45 is schematically illustrated in FIG. 2 and includes a heavy duty inductor 47 with a manual control means 48 (FIG. 1) for adjusting the inductance value of the inductor 47 over a rather large range. The network 45 further includes two heavy duty airdielectric variable capacitors 49 and 51. Manual control means 50 and 52 are operatively connected to the capacitors 49 and 51 respectively for manually independently operating the operating capacitors 49 and 50 to adjust the capacitance value of the network 45 over a large range.

The impedance matching network 45 (FIGS. 1 and 2) further includes a mode switching means 53 that is mounted on the front panel 16 and operatively connected to the inductor 47 and the capacitors 49 and 51 for alternatively mounting such elements in either a capacitance "T" mode or a capacitance "π" mode. Such a feature enables the matching device to be able to match both high and low impedance transmission lines with a particular radio transceiver.

Figure 4:
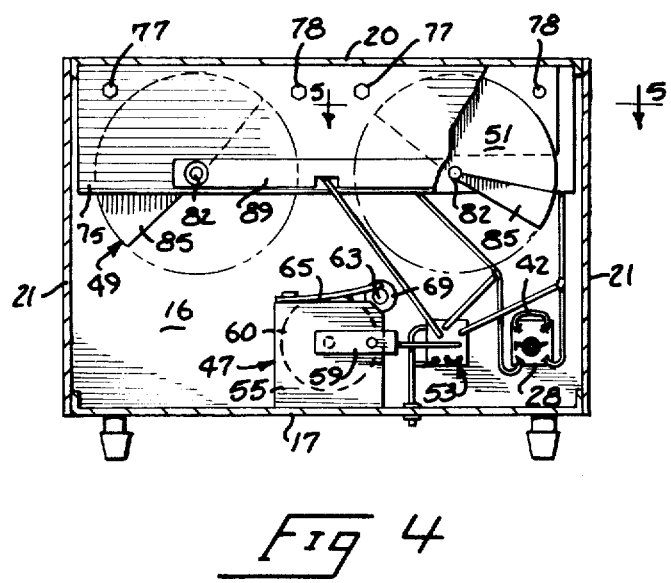
FIG. 4 is a vertical cross-sectional view taken along line 4—4 in FIG. 3.

The inductor 47 is illustrated in more detail in FIGS. 3 and 4. The inductor 47 includes nonconductive end frames 55 that are preferably constructed of high density polyethylene which are mounted firmly to the bottom panel 14 somewhat midposition between the side panels 21. An inductor shaft 56 is rotatably mounted between the end frames 55 with shaft ends extending through the end frames 55. A spring brush conductor 59 is rigidly mounted on one of the end frames 55 with a free brush end engaging the end of the shaft 56 to provide an electrical brush contact. A coil from 60 is mounted coaxially on the shaft 56 with a conductor wire 61 helically mounted on the exterior of the coil form 60 to compose an exposed electrical coil.

The inductor 47 further includes a rod 63 that extends substantially parallel with and spaced from the shaft 56. The rod 63 extends between an end that is supported on a leaf spring conductor 65 and an end that is supported by leaf spring conductor 67. The leaf spring conductors 65 and 67 are rigidly connected to respective end frames 55. The leaf spring conductors 65 and 67 bias the rod 63 toward the shaft 56. A contact roller 69 is movably mounted on the rod 63 to enable the roller to rotate about the rod 63 and to enable the roller 69 to slide axially along the rod 63. The roller 69 has a peripheral groove formed therein to enable the roller to ride firmly on the conductor wire 61. The grooved roller 69 forms a moving electrical tap which moves along the rod to change the effective length and inductance value of the inductor 47 as the shaft is rotated.

The manual control means 48 includes a knob 71 that is rotatably mounted on the front panel 16 with a shaft 72 extending through the front panel and coupled to the shaft end 58. As the knob 71 is rotated, the roller 69 moves axially along the rod contacting the coil providing a continuous moving tap to substantially infinitely vary the inductance of the inductor 47.

The capacitors 49 and 51 utilize common end frames 75 and 76 (FIG. 4 and 5) which are rigidly mounted to and hung from the top panel 20. The end frames 75 and 76 are formed of high density polyethylene. The capacitors 49 and 51 are substantially identical each having mounting rods 77 and 78 that extend between the end frames 75 and 76 for supporting spaced, parallel stationary metal capacitive plates 80. The metal plates 80 extend downward from the mounting rod 77 and 78.

Each of the capacitors 49 and 51 have a shaft 82 that extends between the end frames 75 and 76 immediately below the lower edge of the stationary metal plates 80 with the ends of the shaft 82 extending through the respective end frames 75 and 76. A plurality of semicircular capacitor plates 85 are rigidly mounted to the shaft 82 in spaced, parallel orientations intermediate the stationary metal plates 80. Several of the semicircular plates 85a are angularly offset with respect to the axis of the shaft 82 to provide a more gradual or "feathered" change in the capacitance as the shaft 82 is rotated. Shafts 82 have end collars 87 mounted to its ends. As illustrated in FIGS. 4 and 5, the capacitors 49 and 51 include a common strap conductor 89 that extends between the shafts 82 to electrically interconnect the shafts 82 to provide an electrical interconnection. The ends of the strap conductor 89 are bent in a bow configuration to provide a spring bias on the shafts 82 to cause the shaft 82 to be biased in an axial direction to maintain longitudinal alignment of the semicircular plates 85 with respect to the stationary metal plates 80.

It should be noted that the inductor 47 is centrally mounted on the bottom panel 17 and the capacitors 49 and 50 are moved vertically above with the axes of the shafts 82 straddling the axis of the shaft 56 so as to provide a very compact and efficient orientation of the components.

The manual control means 50 and 52 include knobs 92 that are mounted on the front panel 16 with shafts 93 that extend through the front panel to couplers 94. Couplers 94 connect the knobs 92 with the capacitor shafts 82 to adjust the capacitance value of the capacitors 49 and 51. The mode switching means 53 preferably includes a two-position switch 98 that is of a three pole, double throw type to alternately position and operatively interconnect the inductor 47 and the capacitors 49 and 51 in either a capacitance "T" mode for matching an antenna transmission line having a low impedance or a capacitance "π" configuration for matching an antenna transmission line having a high impedance.

It should be noted that the matching device 10 is quite versatile and has a substantial range. It further should be noted that the matching device is quite compact and sturdy and provides for very efficient operation.

It should be understood that the above described embodiment is simply illustrative of the principles of this invention and numerous other embodiments may be readily devised without deviating therefrom. Therefore, only the following claims are intended to define this invention.

What is claimed is:

1. A wide band impedance matching device for coupling a radio transceiver to an antenna transmission line, comprising:

a chassis housing;

an input connector mounted to the housing and adapted to be operatively connected to the radio transceiver;

an output connector mounted to the housing and adapted to be operatively connected to the antenna transmission line;

a double pole, double throw manual bypass switch means having a first pair of terminals that are electrically connected to a second pair of terminals when the switch is in a "BYPASS" position and that are electrically connected to a third pair of terminals when the switch is in an "ON" position;

a single coaxial feed cable within the housing coupled to the input connector, the output connector and the manual bypass switch having a center conductor which interconnects one of the connectors with one terminal of the first terminal pair and having another conductor coaxial with said center conductor which interconnects the other connector with the other terminal of the first pair;

an impedance matching network electrically connected between the third pair of terminals for manually adjusting the impedance therebetween to match the impedance of the transceiver with the impedance of the antenna transmission line when the bypass switch means is in the "ON" position; and bridging means electrically interconnecting the second pair of terminals so that when the bypass switch means is in the "BYPASS" position the transceiver and antenna transmission line are directly interconnected through the coaxial cable to bypass the impedance matching network and thereby cause a minimum of radio signal attenuation loss.

2. The wide band impedance matching device as defined in claim 1 wherein the impedance matching network includes:
   (a) a variable capacitor mounted in the housing;
   (b) first manual control means mounted to the housing and operatively connected to the variable capacitor for adjusting the variable capacitor to vary the capacitance value of the impedance matching network;
   (c) a variable inductor mounted to the housing; and
   (d) second manual control means mounted to the housing and operatively connected to the variable inductor for adjusting the variable inductor to vary the inductance value of the impedance matching network.

3. The wide band impedance matching device as defined in claim 2 wherein the variable inductor includes:
   (a) a shaft mounted in the housing for rotation about a shaft axis; an electrically non-conductive cylindrical coil form mounted on the shaft for rotation therewith;
   (b) a conducting wire helically mounted on the coil form to form an electrical coil for rotation with the coil form about the shaft axis;
   (c) a conductive rod extending alongside the cylindrical coil form parallel with the shaft axis;
   (d) a conductive roller mounted on the conductive rod for rotation about the rod and for sliding movement along the rod; and
   (e) said roller having a peripheral groove formed therein for receiving and engaging the helical conductor wire to enable the roller to rotate about the rod and to move along the rod as the shaft is rotated about the shaft axis to vary the inductance value of the impedance matching network.

4. The wide band impedance matching device as defined in claim 1 wherein the impedance matching network includes:
   (a) two variable capacitors mounted in the housing;
   (b) a first manual control means mounted to the housing and operatively connected to one variable capacitor for adjusting the one variable capacitor to vary the capacitance of the impedance matching network;
   (c) a second manual control means mounted to the housing and operatively connected to the other variable capacitor for adjusting the other variable capacitor to vary the capacitance of the impedance matching network;
   (d) a variable inductor mounted to the housing;
   (e) a third manual control means mounted to the housing and operatively connected to the variable inductor for adjusting the variable inductor to vary the inductance of the impedance matching network;
   (f) a manual mode switching means mounted to the housing and operatively connected to the two variable capacitors and the variable inductor for electrically connecting the capacitors and inductor in either a capacitance "T" mode for use in matching an antenna transmission line having a low impedance or a capacitance "$\pi$" mode for use in matching an antenna transmission line having a high impedance.

5. The wide band impedance matching device as defined in claim 2 wherein both the capacitor and inductor are mounted on respective shafts that rotatably support in nonconductive high density polyethylene end frames that are affixed to the housing.

6. The wide band impedance matching device as defined in claim 2 wherein the variable capacitor comprises:
   (a) a plurality of spaced parallel metal capacitance plates stationarily positioned at spaced intervals between the dielectric end frames;
   (b) a rotatable shaft extending between the end forms alongside the stationary capacitance plates;
   (c) a plurality of semicircular disc capacitance plates mounted on the shaft intermediate the stationary capacitance plates to enable the shaft to rotate the semicircular disc capacitance plates into and out of registry with the stationary plates to vary the capacitance value of the capacitor;
   (d) wherein the more than one of the semicircular disc capacitance plates being angularly offset about the shaft with respect to the other semicircular disc capacitance plates to gradually change the capacitance value of capacitor as the semicircular disc capacitance plates are rotated into and out of registry with the stationary capacitance plates.

7. The wide band impedance matching device as defined in claim 4 wherein the two variable capacitors include respective capacitor shafts that are rotatably mounted between end frames for rotation about respective capacitor axes that are parallel to and transversely spaced from each other in a horizontal direction; and
   wherein the variable inductor includes a shaft that is rotatably mounted between end frames for rotation about an inductor axis that is parallel to the capacitor axes and horizontally spaced intermediate and vertically spaced from the capacitor axes to provide a compact arrangement of the impedance matching network.

8. The wide band impedance matching device as defined in claim 7 wherein the impedance matching network includes a common strap conductor extending between and electrically interconnecting the capacitor shafts and wherein the strap forms leaf springs that are operatively biased with respect to the capacitor shaft and the end frames to bias the shafts in one axial direction with respect to the end frames.

9. The wide band impedance matching device as defined in claim 3 wherein the inductor shaft is rotatably mounted between end frames and wherein the inductor further includes leaf springs mounted to the end frames with free ends extending outward and resiliently supporting ends of the rod to bias the rod inward toward the shaft to maintain the roller engaged with the conductor wire as the shaft is rotated.

10. A wide band impedance matching device for coupling a radio transceiver to an antenna transmission line, comprising:

a chassis housing;

an input connection mounted to the housing and adapted to be operatively connected to the radio transceiver;

an output connector mounted to the housing and adapted to be operatively connected to the antenna transmission line;

a double pole, double throw manual bypass switch means having a first pair of terminals that are electrically connected to a second pair of terminals when the switch is in a "BYPASS" position and that are electrically connected to a third pair of terminals when the switch is in an "ON" position.

a coaxial cable within the housing coupled to the input connector, the output connector and the manual bypass switch having a center conductor which interconnects one of the connectors with one terminal of the first pair and having another conductor coaxial with said center conductor which interconnects the other connector with the other terminal of the first pair;

bridging means electrically interconnecting the second pair of terminals so that when the bypass switch means is in the "BYPASS" position the transceiver and antenna transmission line are directly interconnected through the coaxial cable with a minimum of radio signal attenuation loss;

two variable capacitors mounted in the housing;

a first manual control means mounted to the housing and operatively connected to one variable capacitor for adjusting the one variable capacitor to vary the capacitance value of the one capacitor;

a second manual control means mounted to the housing and operatively connected to the other variable capacitor for adjusting the other variable capacitor to vary the capacitance value of the capacitor;

a variable inductor mounted to the housing;

a third manual control means mounted to the housing and operatively connected to the variable inductor for adjusting the variable inductor to vary the inductance value of the inductor; and a manual mode switching means mounted to the housing and operatively connected to the two variable capacitors and the variable inductor for electrically connecting the capacitors and inductor in either a capacitance "T" mode for use in matching the transceiver to an antenna transmission line having a low impedance or a capacitance "$\pi$" mode for use in matching the transceiver to an antenna transmission line having a high impedance.

* * * * *